US007998664B2

(12) United States Patent
Noya et al.

(10) Patent No.: US 7,998,664 B2
(45) Date of Patent: Aug. 16, 2011

(54) PROCESSING LIQUID FOR RESIST SUBSTRATE AND METHOD OF PROCESSING RESIST SUBSTRATE USING THE SAME

(75) Inventors: Go Noya, Kakegawa (JP); Masakazu Kobayashi, Kakegawa (JP); Ryuta Shimazaki, Ohizumi-machi (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 319 days.

(21) Appl. No.: 12/223,310

(22) PCT Filed: Feb. 13, 2007

(86) PCT No.: PCT/JP2007/052485
§ 371 (c)(1),
(2), (4) Date: Jul. 25, 2008

(87) PCT Pub. No.: WO2007/094299
PCT Pub. Date: Aug. 23, 2007

(65) Prior Publication Data
US 2010/0233634 A1    Sep. 16, 2010

(30) Foreign Application Priority Data
Feb. 14, 2006    (JP) ................................. 2006-036932

(51) Int. Cl.
G03F 7/00 (2006.01)
G03F 7/26 (2006.01)
G03F 7/32 (2006.01)
C11D 7/50 (2006.01)

(52) U.S. Cl. ..................... 430/331; 430/270.1; 430/325; 430/329; 510/175; 510/176

(58) Field of Classification Search ............... 430/270.1, 430/325, 331, 329, 256; 510/175, 176
See application file for complete search history.

(56) References Cited

U.S. PATENT DOCUMENTS

| | | | |
|---|---|---|---|
| 6,060,209 A | 5/2000 | Kondo et al. | |
| 6,638,899 B1 * | 10/2003 | Wakiya et al. | 510/176 |
| 6,825,156 B2 * | 11/2004 | Lee et al. | 510/176 |
| 7,521,405 B2 * | 4/2009 | Zhang et al. | 510/175 |
| 2003/0049570 A1 | 3/2003 | Endo et al. | |
| 2003/0181349 A1 | 9/2003 | Maeno et al. | |
| 2004/0029396 A1 | 2/2004 | Zhang et al. | |
| 2004/0053800 A1 | 3/2004 | Zhang et al. | |
| 2004/0185370 A1 | 9/2004 | Baik et al. | |
| 2004/0204328 A1 | 10/2004 | Zhang et al. | |
| 2005/0101500 A1 | 5/2005 | Baik et al. | |
| 2006/0008925 A1 | 1/2006 | Takashima | |
| 2006/0124586 A1 | 6/2006 | Kobayashi et al. | |
| 2007/0010409 A1 | 1/2007 | Zhang et al. | |
| 2007/0010412 A1 | 1/2007 | Zhang et al. | |

FOREIGN PATENT DOCUMENTS

| | | | |
|---|---|---|---|
| JP | 8-73893 A | | 3/1996 |
| JP | 8-225797 A | | 9/1996 |
| JP | 10-195487 A | | 7/1998 |
| JP | 11-160878 A | | 6/1999 |
| JP | 11-295902 A | | 10/1999 |
| JP | 2002-201492 A | | 7/2002 |
| JP | 2003-88455 A | | 3/2003 |
| JP | 2003-107744 A | | 4/2003 |
| JP | 2004-184648 A | | 7/2004 |
| JP | 2004184648 A | * | 7/2004 |
| JP | 2004-533010 A | | 10/2004 |
| JP | 2005-292827 A | | 10/2005 |
| JP | 2006-16438 A | | 1/2006 |

OTHER PUBLICATIONS

Machine translation of jp 2004-184648 (no date).*
English Language Abstract of JP 8-225797 A.
English Language Abstract of JP 8-73893.
English Language Abstract of JP 10-195487 A.
English Language Abstract of JP 11-295902 A.
English Language Abstract of JP 2003-107744 A.

* cited by examiner

*Primary Examiner* — Amanda C. Walke
(74) *Attorney, Agent, or Firm* — Sangya Jain

(57) ABSTRACT

The present invention provides a resist substrate treating solution and a method for pattern formation using that treating solution, and thereby problems such as foreign substances on the substrate surface, pattern collapse and pattern roughness can be easily solved at the same time. The treating solution comprises water and an alkylene oxide adduct of a primary amine having a hydrocarbon group of 11 to 30 carbon atoms or of ammonia. The method for pattern formation according to the invention comprises a step of treating the developed pattern with that treating solution.

9 Claims, No Drawings

PROCESSING LIQUID FOR RESIST SUBSTRATE AND METHOD OF PROCESSING RESIST SUBSTRATE USING THE SAME

TECHNICAL FIELD

The present invention relates to a treatment solution for resist substrates. In detail, the invention relates to a resist substrate treating solution and a pattern-formation method using that treatment solution which are advantageously used in a developing process of a photosensitive resin composition employed in production of semiconductor devices, flat panel displays (FPDs) such as liquid crystal display elements, and color filters.

BACKGROUND ART

In extensive fields including the manufacture of semiconductor integrated circuits such as LSIs, the preparation of FPD screens, and the production of circuit boards for color filters, thermal heads and the like, photolithography has hitherto been used for formation of fine elements or microfabrication. In the photolithography, a positive- or negative-working photosensitive resin composition is used for resist pattern formation. In these photosensitive resin compositions, as the positive-working photoresist, a photosensitive resin composition comprising an alkali-soluble resin and a photosensitive substance of quinonediazide compound, for example, is widely used.

Meanwhile, in recent years in manufacturing fine electronic devices, increased integration density and highly accelerated processing speed in LSIs have led to design rules requiring quarter-micron- or finer-scale fabrication rather than half-micron-scale fabrication, which the design rules formerly required. Since conventional light for exposure such as visible light or near UV light (wavelength: 400 to 300 nm) cannot fully cope with the design rules requiring finer fabrication, it is necessary to use radiation of shorter wavelength such as far UV light emitted from a KrF excimer laser (248 nm), an ArF excimer laser (193 nm) or the like, an X-ray or an electron beam. Accordingly, lithographic processes using the radiation of shorter wavelength have been proposed and gradually getting used in practice. To cope with the design rules requiring finer fabrication, the photoresist used in microfabrication must be a photosensitive resin composition capable of giving a pattern of high resolution. Further, it is also desired that the photosensitive resin composition be improved not only in resolution but also in sensitivity and in accuracy on shape and dimension of the pattern. In view of this, as a radiation-sensitive resin composition having sensitivity to the radiation of short wavelength and giving a pattern of high resolution, a "chemically amplified photosensitive resin composition" has been proposed. The chemically amplified photosensitive resin composition comprises a compound that generates an acid when exposed to radiation, and hence when the radiation is applied, the compound generates an acid and the acid serves as a catalyst in image-formation to improve sensitivity. Since the chemically amplified photosensitive resin composition is thus advantageous, it has been getting popularly used in place of conventional photosensitive resin compositions.

However, in accordance with increasing the fineness in fabrication as described above, problems such as foreign substances remaining on the substrate surface, pattern collapse and pattern roughness have been getting apparent. To cope with those problems, various methods have been studied. For example, it is studied to improve resist compositions.

When the developed pattern is washed with pure water, surface tension of the pure water brings negative pressure among lines of the pattern. This negative pressure is presumed to cause pattern collapse. Accordingly, to solve the problem, it is proposed to wash the pattern with a lithographic rinse solution containing a particular nonionic surfactant (see, patent documents 1 and 2).

However, each of the above methods individually improves each of the problems such as foreign substances remaining on the substrate surface, pattern collapse and pattern roughness, and therefore in order to solve all the problems at the same time it is necessary to perform all the methods at the same time. In practice, however, it is difficult to perform all the methods at the same time because complicated operations are required.

[Patent document 1] Japanese Patent Laid-Open No. 2004-184648

[Patent document 2] Japanese Patent Laid-Open No. 2003-107744

DISCLOSURE OF INVENTION

Problem to be Solved by the Invention

The present invention has been made with a view to solving the above problems of the prior art, and an object of the invention is to provide a resist substrate treating solution. In detail, the object is to provide a resist substrate treating solution and a pattern-formation method using that treatment solution which are advantageously used in a developing process of a photosensitive resin composition employed in production of semiconductor devices, flat panel displays (FPDs), color filters and circuit devices, so that the problems such as foreign substances remaining or redeposited on the pattern surface, pattern collapse and pattern roughness can be solved at the same time.

Means for Solving Problem

The resist substrate treating solution according to the invention is characterized by comprising water and an alkylene oxide adduct of a primary amine having a hydrocarbon group of 11 to 30 carbon atoms or of ammonia.

Further, the pattern formation method according to the invention is characterized by comprising the steps of:

(1) coating a substrate with a photosensitive resin composition to form a photosensitive resin composition layer,
(2) subjecting said photosensitive resin composition layer to exposure,
(3) developing the exposed substrate with a developer, and then
(4) treating the substrate with a resist substrate treating solution, said treating solution comprising water and at least one alkylene oxide adduct of a primary amine containing 11 to 30 carbon atoms or of ammonia.

Effect of the Invention

According to the present invention, in manufacturing a resist substrate on which a pattern is formed, the problems such as foreign substances remaining on the pattern surface, pattern collapse and pattern roughness can be solved at the same time by a simple method.

BEST MODE FOR CARRYING OUT THE INVENTION

The resist substrate treating solution according to the invention is characterized by comprising water and an alkylene oxide adduct of a primary amine having a hydrocarbon group of 11 to 30 carbon atoms or of ammonia. Here, the hydrocarbon group is a saturated or unsaturated straight-chain, branched-chain or cyclic hydrocarbon group. The hydrocarbon group preferably has a straight chain structure, and preferably has 12 to 20 carbon atoms.

Any alkylene oxide group can be used, but ethylene oxide or propylene oxide group is preferred. All the hydrogen atoms in the primary amine or in the ammonia are preferably substituted with the alkylene oxide groups.

There is no particular restriction on the amount of alkylene oxide added, but the adduct of a primary amine contains the alkylene oxide in an amount of preferably 4 to 90 mols, more preferably 10 to 60 mols per mol of the primary amine. The adduct of ammonia contains the alkylene oxide in an amount of preferably 2 to 90 mols, more preferably 4 to 60 mols per mol of the ammonia.

The alkylene oxide adduct of a primary amine or of ammonia is preferably represented by the following formula (I) or (II):

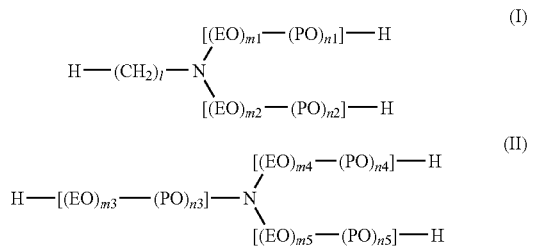

wherein
EO represents —(CH$_2$)$_2$—O—, PO represents —CH$_2$—CH(CH$_3$)—O— and l is 11 to 30, preferably 12 to 20, where the moieties EO and PO may be combined at random or to form blocks.

Each of m1 to m5 and n1 to n5 is an integer of 0 or more, and each of m1+n1, m2+n2, m3+n3, m4+n4 and m5+n5 is 1 or more. Preferably, each of m1, m2, n1 and n2 is independently 0 to 90, more preferably 1 to 60. Also preferably, each of m3, m4, m5, n3, n4 and n5 is independently 0 to 90, more preferably 1 to 50.

Among the alkylene oxide adducts of the formula (I) or (II), particularly preferred adducts are represented by the following formulas:

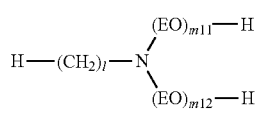

l = 18, m11 + m12 = 40 (Ia)
l = 18, m11 + m12 = 15 (Ib)
l = 12, m11 + m12 = 20 (Ic)

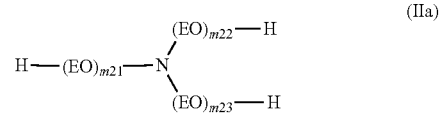

m21 + m22 + m23 = 6; molecular weight = approx. 300

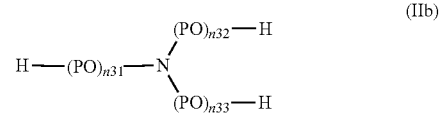

n31 + n32 + n33 = 17; molecular weight = approx. 1,000

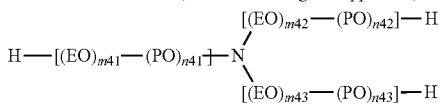

molecular weight = 1,000; all EOs/(all EOs + all POs) = 0.2 (IIc)
molecular weight = 2,500; all EOs/(all EOs + all POs) = 0.2 (IId)
molecular weight = 2,500; all EOs/(all EOs + all POs) = 0.4 (IIe)
molecular weight = 2,500; all EOs/(all EOs + all POs) = 0.6 (IIf)

The above alkylene oxide adducts can be used in combination of two or more, if necessary.

The resist substrate treating solution according to the invention comprises water as well as the alkylene oxide adduct of primary amine or of ammonia. Here the water used in the invention is preferably beforehand subjected to distillation, ion exchange, filtration or various adsorption treatments to remove organic impurities, metal ions and the like, and it is particularly preferred to use pure water.

The concentration of the alkylene oxide adduct of primary amine or of ammonia can be desirably selected according to the kind of resist substrate and required characteristics, but is in the range of generally 0.01 to 2%, preferably 0.05 to 1%, more preferably 0.1 to 1% based on the total weight of the treating solution.

The resist substrate treating solution according to the invention can further contain additives, if necessary. One of the additives is, for example, an alkylene oxide adduct of a diamine in which all the hydrogen atoms of the diamine, such as ethylenediamine or propylenediamine, are substituted with alkylene oxide groups. A preferred example thereof is an alkylene oxide adduct of ethylenediamine represented by the following formula (III):

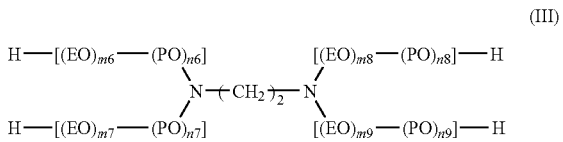

wherein
EO represents —(CH$_2$)$_2$—O—, PO represents —CH$_2$—CH(CH$_3$)—O— and the moieties EO and PO may be combined at random or to form blocks.

Each of m6 to m9 and n6 to n9 is an integer of 0 or more, and each of m6+n6, m7+n7, m8+n8 and m9+n9 is 1 or more. The amount of included ethylene oxide or propylene oxide, namely, the total of m6 to m9 or n6 to n9, respectively, is preferably 20 to 200, more preferably 40 to 140.

If the alkylene oxide adduct of ethylenediamine represented by the formula (III) is used, it is particularly preferred to use an adduct represented by the following formula (IIIa):

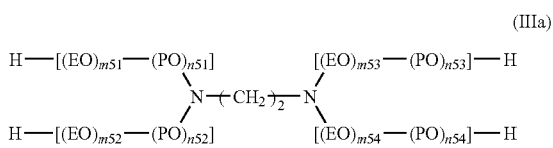

(IIIa)

wherein
m51+m52+m53+m54=36, n51+n52+n53+n54=54, and the molecular weight is approx. 4,800.

The resist substrate treating solution according to the invention can furthermore contain other additives, such as surfactants, acids, bases, organic solvents and the like. The surfactants have effects of improving pattern collapse and pattern exfoliation, and the organic solvents have effects of adjusting surface tension of the treating solution and can improve wettability on the resist surface. Examples of the usable surfactants include: surfactants of fatty acid ether-ester type (e.g., Pionine D-2506D), surfactants of alkylamide ether type, surfactants of alkyl ether type (e.g., Pionine D-1420), surfactants of alkylallyl ether type (e.g., Pionine D-6115), surfactants of polyether type (e.g., Pionine P2820), and polyether surfactants of polyol type (e.g., Pionine P1525). The concentration of the surfactant is generally 0.05 to 2%, preferably 0.1 to 1%. The acids and bases are used to adjust the pH of the treating solution and/or to improve solubility of each component. The acids and bases can be desirably selected unless they impair the effect of the invention. The acids and bases are, for example, carboxylic acids, amines, and ammonium salts. These include fatty acids, aromatic carboxylic acids, primary amines, secondary amines, tertiary amines and ammonium compounds, and they may be substituted with desired substituents. Concrete examples of them include: formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, and tetramethylammonium. The organic solvent usable in the invention is selected from water-soluble organic solvents. Concrete examples of them include: alcohols such as methyl alcohol, ethyl alcohol and isopropyl alcohol; ketones such as acetone and methyl ethyl ketone; esters such as methyl acetate, ethyl acetate and ethyl lactate; dimethylformamide, dimethyl sulfoxide, methyl cellosolve, cellosolve, butyl cellosolve, cellosolve acetate, alkyl cellosolve acetate, propylene glycol alkyl ether, propylene glycol alkyl ether acetate, butyl carbitol, carbitol acetate, and tetrahydrofuran. In many cases where those solvents are used, the amount of the solvent is 10 weight parts or less based on 100 weight parts of water.

In the following description, the method for pattern formation according to the invention is explained. The lithographic process in the pattern-formation method of the invention can be carried out in any known manner of forming a resist pattern from a conventional positive- or negative-working photosensitive resin composition. A typical pattern-formation method in which the resist substrate treating solution of the invention is used is described below.

First, a photosensitive resin composition is spread on a surface (which may be pretreated, if necessary) of a substrate (such as a silicon substrate or a glass substrate) according to a known coating method (such as spin-coating method), to form a photosensitive resin composition layer. Prior to the coating of the photosensitive resin composition, an antireflection film may be beforehand formed by coating under or above the resist. The antireflection film can improve the section shape and the exposure margin.

Any known photosensitive resin composition can be used in the pattern-formation method of the invention. Representative examples of the compositions usable in the invention include: a composition comprising a quinonediazide type photosensitizing agent and an alkali-soluble resin, a chemically amplified photosensitive resin composition (which are positive-working compositions); a composition comprising a photosensitive functional group-containing polymer such as polyvinyl cinnamate, an azide compound containing composition, for example, an aromatic azide compound containing composition or a composition comprises a bisazide compound and a cyclized rubber, a composition comprising a diazo resin, a photo-polymerizable composition comprising an addition-polymerizable unsaturated compound, and a chemically amplified negative-working photosensitive resin composition (which are negative-working compositions).

Examples of the photosensitive substance of quinonediazide type used in the positive-working photosensitive composition comprising a photosensitive substance of quinonediazide type and an alkali-soluble resin include: 1,2-benzoquinonediazide-4-sulfonic acid, 1,2-naphthoquinonediazide-4-sulfonic acid, 1,2-naphthoquinonediazide-5-sulfonic acid, and sulfonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more of phenols such as phenol, o-cresol, m-cresol, p-cresol and xylenol in combination with one or more of aldehydes such as formaldehyde and paraformaldehyde.

Either positive- or negative-working chemically amplified photosensitive resin composition can be used in the pattern-formation method of the invention. The chemically amplified resist generates an acid when exposed to radiation, and the acid serves as a catalyst to promote chemical reaction by which solubility to a developer is changed within the areas irradiated with the radiation to form a pattern. For example, the chemically amplified photosensitive resin composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

The photosensitive resin composition layer formed on the substrate is prebaked, for example, on a hot plate to remove solvent contained in the composition, and thereby a photoresist film having a thickness of normally 0.5 to 2.5 microns is prepared. The prebaking temperature depends on the solvent and the photosensitive resin composition, but is normally 20 to 200° C., preferably 50 to 150° C. The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. The resist is normally developed with an alkali developer. Examples of the alkali developer include an aqueous solution or a water-based solution of sodium hydroxide or tetramethylammonium hydroxide (TMAH). After the development, the resist pattern is rinsed (washed) with a rinse solution. The thus-formed resist pattern is employed as a resist for etching, plating, ion diffusion or dyeing, and then, if necessary, peeled away.

The pattern-formation method of the invention can effectively improve pattern collapse and pattern exfoliation even if the resist pattern is fine and has a high aspect ratio. Accordingly, the method of the invention is preferably combined with a lithographic process for forming a fine resist pattern, namely, with a lithographic process comprising exposure to radiation having a wavelength of 250 nm or shorter such as light emitted from a KrF excimer laser or an ArF excimer laser, an X-ray or an electron beam. With respect to pattern dimension, the invention is preferably combined with a lithographic process for forming a resist pattern in which the line width of a line-and-space pattern or the opening size of a contact hole pattern is 300 nm or less.

In the pattern-formation method of the invention, the developed resist pattern is treated with a resist treating solution comprising water and at least one alkylene oxide adduct of a primary amine containing 11 to 30 carbon atoms or of ammonia. The treating solution is described above, and preferably comprises an alkylene oxide adduct represented by the formula (I) or (II).

There is no particular restriction on the concentration, in the treating solution, of the alkylene oxide adduct of a primary amine containing 11 to 30 carbon atoms or of ammonia, but the concentration is preferably adjusted according to the aims and the way of using. The alkylene oxide adduct in a high concentration has large effect on pattern collapse and reattached foreign substances, but if it is too concentrated the resist surface is liable to suffer melting. Further, in some photosensitive resin compositions, the optimum concentration for preventing pattern collapse is not identical with that for preventing reattached foreign substances. It is, therefore, preferred to select a balanced concentration according to desired characteristics. For the above reason, the best concentration of the alkylene oxide adduct is not fixed. However, in order to prevent pattern collapse mainly, the concentration is preferably 0.01 to 5%, more preferably 0.05 to 2%, further preferably 0.1 to 1%. In order to prevent reattached foreign substances mainly, it is preferably 0.01 to 2%, more preferably 0.05 to 1%, further preferably 0.1 to 1%. There is no particular restriction on how long the resist substrate is in contact with the treating solution, namely, on the treatment time. However, the treatment time is generally 1 second or more so that the invention can take effect.

In the pattern-formation method of the invention, the developed resist pattern can be subjected to rinse with pure water before and/or after the treatment with the particular resist treating solution of the invention. The pure water-rinse before the treatment is for washing out a developer remaining on the resist pattern, and that after the treatment is for washing out the treating solution. The rinse with pure water can be carried out in a desired manner. For example, the resist substrate is immersed in the rinse solution, or otherwise the rinse solution is dropped or sprayed onto the substrate surface while the substrate is rotating. The pure water-rinse can be carried out either before or after, or otherwise both before and after the treatment with the resist treating solution. Since the treating solution of the invention is used in a relatively high concentration, the pure water-rinse after the treatment is preferably carried out to remove the treating solution. Particularly in the case where the treating solution has a high concentration of more than 1%, the pure water-rinse after the treatment fully brings out the effect of the invention without causing the aforementioned troubles such as melting. Accordingly, if the resist treating solution of a relatively high concentration is used, the rinse with pure water is preferably carried out after the treatment.

The following Examples further illustrate the present invention, but are not intended to limit it.

COMPARATIVE EXAMPLE 1

An 8 in. silicon wafer was coated with an antireflection film AZ KrF-17B ("AZ" is a registered trademark, as in the subsequent descriptions) manufactured by AZ Electronic Materials (Japan) K.K. by a spin coater manufactured by Tokyo Electron Ltd. while the silicon wafer was rotating. The coated silicon wafer was baked on a hot plate at 190° C. for 90 seconds, to obtain an 800 Å-thick film. The film thickness was measured with a thickness measurement system manufactured by ProMetrics, Inc. The thus obtained antireflection film was coated with a photoresist AZ DX6270P (chemically amplified photoresist suitable for exposure to light of 248 nm comprising a polymer of polystyrene skeleton) manufactured by AZ Electronic Materials (Japan) K.K. while the silicon wafer was rotating. The silicon wafer was then baked on a hot plate at 125° C. for 90 seconds, to obtain a 0.67 μm-thick resist film. Thereafter, exposure using Quadropole was carried out by means of a reduction projection exposure system FPA3000EX5 (wavelength: 248 nm) manufactured by Canon Inc. After the exposure, the silicon wafer was baked on a hot plate at 130° C. for 90 seconds, and then paddle development (23° C., 1 minute) was carried out with a developer AZ 300MIF (2.38 wt. % aqueous solution of tetramethylammonium hydroxide) manufactured by AZ Electronic Materials (Japan) K.K. Successively, rinse with pure water and then spin-drying were carried out to prepare a 1:1 line-and-space pattern of 150 nm.

EXAMPLES 1 to 3

The procedure of Comparative Example 1 was repeated, except that the drying after the rinse with pure water was not carried out but the rinsed silicon wafer was immediately placed and immersed for 15 seconds in the resist treating solution which was prepared beforehand by dissolving each of the alkylene oxide adducts shown in Table 1 in pure water, and then rinsed with pure water.

Evaluation of Pattern Roughness

The surfaces of the resist substrates obtained were individually observed with a CD-SEM S-9200, to evaluate pattern roughness. The results were as set forth in Table 1.

Evaluation of Pattern Collapse

The resist substrates obtained were individually observed with a CD-SEM S-9200 (manufactured by Hitachi, Ltd.), to evaluate pattern collapse in the case where the resist substrate was subjected to exposure of 30 mJ. The results were as set forth in Table 1.

Evaluation of Foreign Substances Reattached on the Pattern Surface

The resist substrate obtained were individually observed with a defect inspection system KLA2115 (manufactured by KLA-Tencor Corporation), to evaluate foreign substances reattached on the pattern surface. The results are set forth in Table 1.

The pattern roughness was evaluated in respect of each of LWD (line width roughness) and LER (line edge roughness), and the substrates observed were graded according the following criteria.

A: The pattern roughness was improved by 2 nm or more as compared with that of Comparative Example.

B: The pattern roughness was within the range of ±2 nm based on that of Comparative Example.
C: The pattern was rougher by 2 nm or more than that of Comparative Example.

With respect to the pattern collapse, the observed substrates were graded according the following criteria.
A: No pattern collapse was observed.
B: Pattern collapse was observed in one line.
C: Pattern collapse was observed in two or more lines.

TABLE 1

| | Alkylene oxide adduct | | Pattern | | Reattached |
|---|---|---|---|---|---|
| | | Conc. | roughness* | Pattern | foreign |
| | Compound | (%) | LWR  LER | collapse | substances |
| Comp. Ex. | — | — | —   — | — | C | 7776 |
| Example 1 | formula(Ia) | 1 | A   A | A | 0 |
| Example 2 | formula(IIb) | 1 | A   A | A | 0 |
| Example 3 | formula(IIc) | 1 | A   A | A | 0 |

LWR: Line Width Roughness,
LER: Line Edge Roughness

COMPARATIVE EXAMPLE 2

An 8 in. silicon wafer was coated with an antireflection film AZ 1C5D manufactured by AZ Electronic Materials (Japan) K.K. by a spin coater manufactured by Tokyo Electron Ltd. while the silicon wafer was rotating. The coated silicon wafer was baked on a hot plate at 175° C. for 60 seconds, to prepare a 370 Å-thick film. The thickness was measured with a thickness measurement system manufactured by ProMetrics, Inc. The thus obtained antireflection film was coated with a photoresist AZ AX1120P (chemically amplified photoresist suitable for exposure to light of 193 nm comprising a polymer of polymethacrylic acid skeleton) manufactured by AZ Electronic Materials (Japan) K.K. while the silicon wafer was rotating. The silicon wafer was then baked on a hot plate at 120° C. for 60 seconds, to obtain a 0.26 μm-thick resist film. Thereafter, exposure was carried out by means of an ArF scanner NSR306D manufactured by Nikon Corporation. After the exposure, the silicon wafer was baked on a hot plate at 120° C. for 60 seconds, and then paddle development (23° C., 1 minute) was carried out with a developer AZ 300MIF (2.38 wt. % aqueous solution of tetramethylammonium hydroxide) manufactured by AZ Electronic Materials (Japan) K.K. Successively, rinse with pure water and then spin-drying were carried out to prepare a 1:1 line-and-space pattern of 80 nm.

EXAMPLES 4 to 12

The procedure of Comparative Example 2 was repeated, except that the drying after the rinse with pure water was not carried out but the rinsed silicon wafer was immediately placed and immersed for 15 seconds in the resist treating solution which was prepared beforehand by dissolving each alkylene oxide adduct shown in Table 2 in pure water, and then rinsed with pure water.

Each of the patterns obtained in Comparative Example 2 and Examples 4 to 12 was observed with a CD-SEM S-9200, to evaluate pattern collapse in the case where the resist was subjected to exposure of 50 mJ. The results are as follows.

TABLE 2

| | Alkylene oxide adduct | | Reattached |
|---|---|---|---|
| | Compound | Conc. (%) | foreign substances |
| Comp. Ex. 2 | — | — | C |
| Example 4 | formula(Ia) | 1 | A |
| Example 5 | formula(Ib) | 1 | A |
| Example 6 | formula(Ic) | 1 | A |
| Example 7 | formula(IIa) | 1 | A |
| Example 8 | formula(IIb) | 1 | A |
| Example 9 | formula(IIc) | 1 | A |
| Example 10 | formula(IId) | 1 | A |
| Example 11 | formula(IIe) | 1 | A |
| Example 12 | formula(IIf) | 1 | A |

EXAMPLE 13

The procedure of Example 1 was repeated, except that the compound and the concentration of the alkylene oxide adduct contained in the resist treating solution were changed to treat the resist substrate. In addition, the pattern collapse and the reattached foreign substances were also evaluated in the case where the pure water-rinse immediately after the development was alone omitted and in the case where the pure water-rinse both immediately after the development and after the treatment with the resist treating solution was omitted. The results are set forth in Tables 3 and 4.

TABLE 3

Evaluation of pattern collapse in the case where the concentration of the treatment liquid was changed.

| Alkylene oxide adduct | Process | Concentration of treatment liquid (%) | | | | | | |
|---|---|---|---|---|---|---|---|---|
| | | 0% | 0.01% | 0.05% | 0.1% | 1% | 2% | 5% |
| formula(Ia) | develop*-treat** | C | A | A | A | melt. | melt. | melt. |
| | develop-treat-rinse*** | C | A | A | A | A | A | A |
| | devepol-rinse-treat-rinse | C | A | A | A | A | A | A |
| formula(Ib) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(Ic) | develop-treat | C | A | A | A | melt. | melt. | melt. |
| | develop-treat-rinse | C | A | A | A | A | A | A |
| | devepol-rinse-treat-rinse | C | A | A | A | A | A | A |

TABLE 3-continued

Evaluation of pattern collapse in the case where the concentration of the treatment liquid was changed.

| Alkylene oxide adduct | Process | Concentration of treatment liquid (%) | | | | | | |
|---|---|---|---|---|---|---|---|---|
| | | 0% | 0.01% | 0.05% | 0.1% | 1% | 2% | 5% |
| formula(IIb) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(IIc) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(IId) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(IIe) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(IIf) | develop-treat | C | A | A | A | melt. | melt. | melt. |
| | develop-treat-rinse | C | A | A | A | A | A | A |
| | devepol-rinse-treat-rinse | C | A | A | A | A | A | A |
| formula(Ib) 50% + formula(IIe) 50% | develop-treat | C | A | A | A | melt. | melt. | melt. |
| | develop-treat-rinse | C | A | A | A | A | A | A |
| | devepol-rinse-treat-rinse | C | A | A | A | A | A | A | melt.: the resist surface was melted.
develop*: development
treat**: treatment with the treating solution
rinse***: rinse with pure water

TABLE 4

Evaluation of the number of reattached foreign substances in the case where the concentration of the treatment liquid was changed.

| Alkylene oxide adduct | Process | Concentration of treatment liquid (%) | | | | | | |
|---|---|---|---|---|---|---|---|---|
| | | 0% | 0.01% | 0.05% | 0.1% | 1% | 2% | 5% |
| formula(Ia) | develop*-treat** | 22103 | 0 | 0 | 0 | 0 | 0 | 0 |
| | develop-treat-rinse*** | 8903 | 0 | 0 | 0 | 0 | 0 | 0 |
| | devepol-rinse-treat-rinse | 7692 | 0 | 0 | 0 | 0 | 0 | 0 |
| formula(Ib) | develop-treat | 19311 | 0 | 0 | 0 | 0 | 0 | 0 |
| | develop-treat-rinse | 6758 | 0 | 0 | 0 | 0 | 0 | 0 |
| | devepol-rinse-treat-rinse | 11715 | 0 | 0 | 0 | 0 | 0 | 0 |
| formula(Ic) | develop-treat | 15912 | 0 | 0 | 0 | 0 | 0 | 0 |
| | develop-treat-rinse | 7068 | 0 | 0 | 0 | 0 | 0 | 0 |
| | devepol-rinse-treat-rinse | 6453 | 0 | 0 | 0 | 0 | 0 | 0 |
| formula(IIb) | develop-treat | 35012 | 0 | 0 | 0 | 0 | 0 | 0 |
| | develop-treat-rinse | 13876 | 0 | 0 | 0 | 0 | 0 | 0 |
| | devepol-rinse-treat-rinse | 19420 | 0 | 0 | 0 | 0 | 0 | 0 |
| formula(IIc) | develop-treat | 9401 | 0 | 0 | 0 | 0 | 0 | 0 |
| | develop-treat-rinse | 12462 | 0 | 0 | 0 | 0 | 0 | 0 |
| | devepol-rinse-treat-rinse | 9886 | 0 | 0 | 0 | 0 | 0 | 0 |
| formula(IId) | develop-treat | 19264 | 0 | 0 | 0 | 0 | 0 | 0 |
| | develop-treat-rinse | 9605 | 0 | 0 | 0 | 0 | 0 | 0 |
| | devepol-rinse-treat-rinse | 14761 | 0 | 0 | 0 | 0 | 0 | 0 |
| formula(IIe) | develop-treat | 29812 | 0 | 0 | 0 | 0 | 0 | 0 |
| | develop-treat-rinse | 10342 | 0 | 0 | 0 | 0 | 0 | 0 |
| | devepol-rinse-treat-rinse | 8561 | 0 | 0 | 0 | 0 | 0 | 0 |
| formula(IIf) | develop-treat | 19831 | 0 | 0 | 0 | 0 | 0 | 0 |
| | develop-treat-rinse | 18273 | 0 | 0 | 0 | 0 | 0 | 0 |
| | devepol-rinse-treat-rinse | 9932 | 0 | 0 | 0 | 0 | 0 | 0 |
| formula(Ib) 50% + formula(IIe) 50% | develop-treat | 20097 | 0 | 0 | 0 | 0 | 0 | 0 |
| | develop-treat-rinse | 8115 | 0 | 0 | 0 | 0 | 0 | 0 |
| | devepol-rinse-treat-rinse | 8158 | 0 | 0 | 0 | 0 | 0 | 0 | melt.: the resist surface was melted.
develop*: development
treat**: treatment with the treating solution
rinse***: rinse with pure water

The invention claimed is:

1. A resist substrate treating solution, comprising water and an alkylene oxide adduct represented by the following formula (I) or (II):

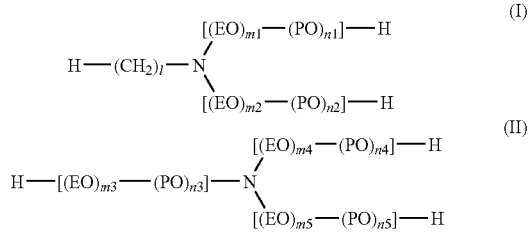

wherein
EO represents —$(CH_2)_2$—O—, PO represents —$CH_2$—$CH(CH_3)$—O— and I is 11 to 30 where the moieties EO and PO may be combined at random or to form blocks; and each of m1, m2, n1 and n2 is independently 1 to 60, each of m3 to m5 and n3 to n5 is an integer of 0 or more provided that each of m3+n3, m4+n4 and m5+n5 is 1 or more.

2. The resist substrate treating solution according to claim 1, wherein said alkylene oxide adduct is represented by the following formula (I) or (II):

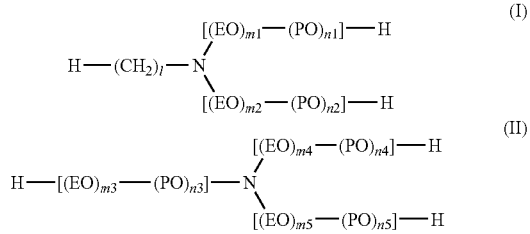

wherein
EO represents —$(CH_2)_2$—O—, PO represents —$CH_2$—$CH(CH_3)$—O— and I is 11 to 30 where the moieties EO and PO may be combined at random or to form blocks; and each of m1, m2, n1 and n2 is independently 1 to 60, and each of m3, m4, m5, n3, n4 and n5 is independently 1 to 50.

3. A method for pattern formation, comprising the steps of:
(1) coating a substrate with a photosensitive resin composition to form a photosensitive resin composition layer,
(2) subjecting said photosensitive resin composition layer to exposure,
(3) developing the exposed substrate with a developer, and then
(4) treating the substrate with a resist substrate treating solution, said solution comprising water and at least one alkylene oxide adduct represented by the following formula (I) or (II):

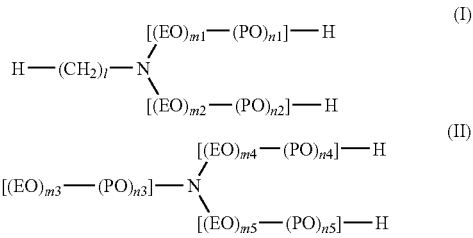

wherein
EO represents —$(CH_2)_2$—O—, PO represents —$CH_2$—$CH(CH_3)$—O— and I is 11 to 30 where the moieties EO and PO may be combined at random or to form blocks; and each of m1, m2, n1 and n2 is independently 1 to 60, each of m3 to m5 and n3 to n5 is an integer of 0 or more provided that each of m3+n3, m4+n4 and m5+n5 is 1 or more.

4. The method for pattern formation according to claim 3, further comprising at least one of the steps of:
(3a) treating the substrate surface with pure water between the steps (3) and (4), and
(4a) treating the substrate surface with pure water after step (4).

5. The method for pattern formation according to claim 3, wherein said alkylene oxide adduct is represented by the following formula (I) or (II):

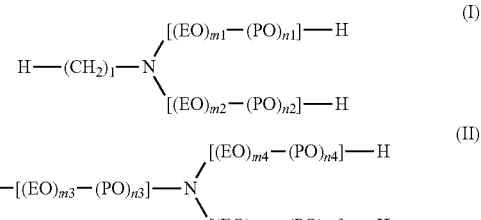

wherein
EO represents —$(CH_2)_2$—O—, PO represents —$CH_2$—$CH(CH_3)$—O— and I is 11 to 30 where the moieties EO and PO may be combined at random or to form blocks; and each of m1, m2, n1 and n2 is independently 1 to 60, and each of m3, m4, m5, n3, n4 and n5 is independently 1 to 50.

6. The resist substrate treating solution according to claim 1 further comprising an additive selected from surfactant, acid, base, ammonium salt, and organic solvent.

7. The resist substrate treating solution according to claim 1, where the adduct has a concentration in the range of 0.01% to 2% based on total weight of the treating solution.

8. The method of claim 3, where the resist substrate treating solution further comprising an additive selected from surfactant, acid, base, ammonium salt, and organic solvent.

9. The method of claim 3, where the adduct has a concentration in the range of 0.01% to 2% based on total weight of the treating solution.

* * * * *